United States Patent [19]

Anderson

[11] Patent Number: 5,002,856

[45] Date of Patent: Mar. 26, 1991

[54] THERMALLY STABLE CARBAZOLE DIAZONIUM SALTS AS SOURCES OF PHOTO-INITIATED STRONG ACID

[75] Inventor: Albert G. Anderson, Wilmington, Del.

[73] Assignee: E. I. Du Pont de Nemours and Company, Wilmington, Del.

[21] Appl. No.: 388,404

[22] Filed: Aug. 2, 1989

[51] Int. Cl.$^5$ .................. G03C 1/68; G03C 1/52; G03F 7/038

[52] U.S. Cl. .................. 430/280; 430/163; 430/171; 430/176; 430/914; 522/32; 522/178; 534/560

[58] Field of Search ............ 430/171, 176, 914, 163; 534/559, 560, 562

[56] References Cited

U.S. PATENT DOCUMENTS

| | | |
|---|---|---|
| 2,540,057 | 7/1947 | Sprung et al. ............ 534/560 |
| 3,062,644 | 11/1962 | Neugebauer et al. ............ 430/171 |
| 3,219,447 | 11/1965 | Neugebauer et al. ............ 430/163 |
| 3,721,616 | 3/1973 | Watt ............ 204/159.11 |
| 3,721,617 | 3/1973 | Watt ............ 204/159.11 |
| 3,890,152 | 6/1975 | Ruckert et al. ............ 430/170 |
| 3,957,489 | 5/1976 | Moore ............ 430/163 |
| 3,960,684 | 6/1976 | Feinberg ............ 204/159.11 |
| 4,482,489 | 11/1984 | DiPippo ............ 430/176 |

OTHER PUBLICATIONS

Moran et al., J. Chem. Soc., 121, 2709 (1922).

Primary Examiner—Paul R. Michl
Assistant Examiner—John S. Y. Chu

[57] ABSTRACT

This invention relates to carbazole diazonium salts which are used in pre-polymer or polymer compositions as sources of photoinitiated strong acids in such developments as imaging films where strong acids are needed to effect polymerization of the film or to remove protective groups.

23 Claims, No Drawings

THERMALLY STABLE CARBAZOLE DIAZONIUM SALTS AS SOURCES OF PHOTO-INITIATED STRONG ACID

BACKGROUND OF THE INVENTION

1. Field of the Invention

This invention relates to carbazole diazonium salts and the use of such carbazole diazonium salts in prepolymer or polymer compositions as sources of photo-initiated strong acids. Diazonium salts are used as photoinitiators in such developments as imaging films where strong acids are needed to effect polymerization of the film or to remove protective groups.

2. Prior Art

The prior art discloses the use of diazonium salts as sources of photogenerated strong acid. However, when these diazonium salts are formulated with epoxy monomers or pre-polymers, the mixtures result in premature polymerization. The mixtures thus result in unstable compositions. Various measures have been used to overcome the problem of premature polymerization.

U.S. Pat. No. 3,721,616 discloses a process whereby polymerization of epoxide monomers and pre-polymers, and of other materials that are polymerizable through the action of cationic catalysts, is controlled in compositions essentially free of volatile solvents, by providing in such compositions, in association with a radiation-sensitive catalyst precursor, a gelation inhibitor in the form of a nitrile compound such as acetonitrile present in small amounts up to several percent by weight. The patent discloses that without the use of a nitrile, epoxide and related compositions containing photosensitive catalyst precursors gel upon standing, even in the absence of an energy source such as light or ultraviolet radiation. This tendency to undergo premature reaction is particularly troublesome in the case of formulations which are effectively free of unreactive liquid diluents or solvents and results in decreased shelf life and utility. However, the use of a nitrile as a gelation inhibitor is not completely satisfactory, because the viscosity of the diazonium salt/epoxide mixture increases over time.

U.S. Pat. No. 3,721,617 discloses a process whereby polymerization of epoxide monomers and pre-polymers, and of other materials polymerizable through the action of cationic catalysts, is controlled by providing, in conjunction with a radiation-sensitive catalyst precursor, a gelation inhibitor in the form of a cyclic amide. The presence of the cyclic amide reduces the tendency of the composition to gel upon standing, even in the absence of light or ultraviolet radiation. However, the solutions are not stable because the viscosity of the diazonium salt/epoxide mixture increases with time. The polymerization reaction is exothermic and, where large masses are involved, can generate sufficient heat to cause combustion of the epoxide resins.

U.S. Pat. No. 3,960,684 provides stable diazonium catalyst solutions in which the catalyst is dissolved in an organic sulfone. The catalyst solutions have extended shelf life while retaining the ability to rapidly cure epoxy resins upon exposure to an energy source. However, the solutions are not stable because the viscosity of the diazonium salt/epoxide mixture increases with time.

The three inhibitors, i.e. nitriles, amides and sulfones act as weak bases to remove part of the acid formed in a thermal Schiemann reaction of the diazonium salt. The thermal Schiemann reaction can occur in the dark. The gelation inhibitors cannot stop this reaction; they only delay or reduce the effect of the acids produced.

Gilbert T. Moran and Hugh Norman Read, *J. Chem. Soc.*, 121, 2709 (1922) disclose that carbazole-3-diazonium salts are stable to the reaction conditions by which they are prepared when compared with the corresponding diazo derivatives of the benzene, diphenyl and naphthalene series. For instance, 3-amino carbazole can be diazotized at 0°–8° C. and N-ethyl-3-amino carbazole can be diazotized at 15°–20° C. In addition, they report that the action of light on N-ethyl-carbazole-3-diazonium chloride was inappreciable.

Contrary to Moran and Read, Applicants have found that the carbazole diazonium salts described are very sensitive to light.

The present invention overcomes the need for the addition of a gelation inhibitor by using carbazole diazonium salts as radiation-sensitive catalysts. These compounds have been found to be thermally stable in the pre-polymer or polymer composition in the absence of light.

SUMMARY OF THE INVENTION

The invention discloses the use of carbazole diazonium salts of the following structures:

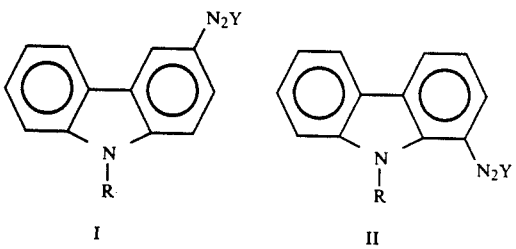

wherein:

Y is $BF_4^-$, $PF_6^-$, $AsF_6^-$, $SbF_6^-$, $FeCl_4^-$, $SnCl_6^{-2}$, $SbCl_6^-$ or $BiCl_5^{-2}$; and R is selected from the group consisting of $C_xH_{2x+1}$ where x is 1–16, benzyl, phenyl, substituted benzyl, substituted phenyl and cycloalkyl, provided, however, where $-N_2Y$ is in the "1" position as in formula II, R is not phenyl or substituted phenyl;

as photoinitiated sources of strong acids such as $BF_3$, $PF_5$, $AsF_5$, $SbF_5$, $FeCl_3$, $SnCl_4$, $SbCl_5$, and $BiCl_3$. The diazonium salts of the present invention are used in films, e.g. imaging films, in which a strong acid is needed to effect polymerization or to remove protective groups from a polymer film so as to make exposed areas easily removable by chemical treatment.

Although diazonium salts are known as photoinitiated sources of strong acids, the carbazole diazonium salts described herein, when used in epoxy pre-polymer compositions, are unique in showing no loss of photospeed on dark storage and in being stable, in the absence of light, for extended periods of time. These properties are particularly helpful when the carbazole diazonium salts are used in imaging films as they eliminate fogging of the film caused where there is liberation of acid in the absence of light (dark reaction), a problem experienced with other diazonium salts.

DETAILS OF THE INVENTION

The carbazole diazonium salts of this invention are useful in combination with any pre-polymer or polymer that requires strong acid to effect either polymerization of the pre-polymer or removal of protective groups from the polymer structure. An example of a pre-polymer which can be used in the process of this invention is Ciba Geigy ECN-1299 which is a polyglicidyl ether of orthocresolformaldehyde novolac resin. Examples of polymers containing protective groups may be found in, but are not limited to, such patents as U.S. Pat. Nos. 4,491,628 (IBM) and 3,779,778 (3M).

The concentration of the pre-polymer or polymer in the coating solution can range from 10 to 30 wt/v %.

The carbazole diazonium salts that are useful for this invention include the following structures

[Structures I and II shown with N₂Y groups on carbazole rings with N-R substituent]

wherein:

Y is $BF_4^-$, $PF_6^-$, $AsF_6^-$, $SbF_6^-$, $FeCl_4^-$, $SnCl_6^{-2}$, $SbCl_6^-$ or $BiCl_5^{-2}$; and R is selected from the group consisting of $C_xH_{2x+1}$ where x is 1-16, benzyl, phenyl, substituted benzyl, substituted phenyl and cycloalkyl, provided, however, where —$N_2Y$ is in the "1" position as in formula II, R is not phenyl or substituted phenyl.

The concentration of the diazonium salts in the coating solution can range from 5 to 30 wt/v %.

These carbazole diazonium salts have been shown to be stable in films for long periods of time, when stored in the absence of light.

The photo-reaction can be initiated with various sources of radiation including x-ray, ultraviolet, visible or E-beam radiation. It is also to be understood that IR radiation can be used, if so desired, to effect the thermal Schiemann reaction.

Any solvent or solvent mixture may be used to dissolve the diazonium salt and polymer for application to the substrate with the requirement that it does not effect decomposition of any of the components. The preferred solvent system for the carbazole diazonium salt/ECN-1299 pre-polymer mixture is a 50/50(v/v) solvent mixture of cellosolve/acetonitrile.

The solution, in addition to containing the polymer or pre-polymer and diazonium salt, may optionally contain a photosensitizer such as, but not limited to, 9,10-dimethylanthracene.

The solution can be used to coat various substrates including, but not limited to, aluminum, glass and plastic materials, such as polyethylene terephthalate films.

Details of applying the coating to the substrates, exposure of the plates to radiation and development of the plates are provided in the following Examples.

EXAMPLES

Testing Procedure for Coated Films

A. General

A metal plate [e.g. *MR (medium run grade) grained aluminum plate with one micron thick alumina layer which is silicate treated and anodized] was coated with a solution containing photoinitiator and epoxy pre-polymer and dried. The dried plate was exposed to UV radiation for a specified time through a step wedge or other device to vary the relative exposure on the plate. The unexposed (unpolymerized) epoxy pre-polymer was then rinsed from the plate leaving a negative image. This image was visualized by inking the plate or by dipping the plate in a solution of a suitable dye. The presence or absence of any image, or the number of steps on a step wedge, was recorded as a measure of the ability of the compound to act as a photopolymerization initiator.

*Available from Advanced Litho Plate Co., Holyoke, Mass.

B. Epoxy Pre-polymer

In all cases Ciba Geigy ECN-1299 (polyglycidyl ether of ortho-cresol-formaldehyde novolac resin) was used.

C. Characteristics of the Light Source

The light source used was a 275 watt General Electric sunlamp #22 shielded with an aluminum cone enclosed in the upper section of a two-section ¾" plywood box equipped with movable shelves in the lower section. The IR radiation from the lamp was removed by placing a 4" thick water-filled quartz IR filter under the sunlamp. The flux was measured by an Ultra Violet Products UV meter 49-5082.

D. Coating Solvent

Cellosolve/acetonitrile (50/50 v/v) was used as the solvent.

E. Application of the Coating

The plates were coated with a solution containing 5% (w/v) of the desired carbazole diazonium salt and 10% (w/v) of ECN-1299 inside a glove box painted black and faced with DP480 amber sheeting. The mixture was coated with a doctor knife set at 3 mil or spin coated at 1000 to 3000 rpm with equally good results.

F. Exposure

The plates were exposed in a horizontal position. A step wedge was placed over the plate and was held close to the plate by a coverglass of ⅛" quartz.

G. Development

The exposed plates were rinsed with acetone. The image was visualized by wetting the plate with water, treating the plate with Lydel ™ developer and inking with black ink. Alternately, the plate was dipped in a saturated ethyl acetate solution of Ciba Geigy Orasol Black CN ™ or CR ™. The CN gave a black image while CR gave a dark blue image. The plate was washed in a solution of ethyl acetate/acetone 1:1 (v/v) to remove excess dye and then dried.

H. NMR

All NMR spectra are reported in ppm relative to tetramethyl silane as an internal standard.

EXAMPLE 1

Preparation of 9-Ethyl-3-Carbazolediazonium Hexafluoroantimonate

A solution containing 3-amino-9-ethyl carbazole (5 g, 24 mmole) in 30 ml of glacial acetic acid was cooled to 15° C. To the cooled solution was added 1.7 g of $NaNO_2$ in 3 ml of water. The solution was stirred for 3 minutes. $NaSbF_6$ (6.16 g, 24 mmole) in 10 ml of water was added to the solution resulting in the formation of a green-yellow precipitate. The slurry was diluted with 100 ml of water, stirred and filtered. The filtered solid was washed with 4×50 ml of water then with a solution of 1 gram of sulfamic acid in 15 ml of $H_2O$, and dried by vacuum filtration. The dried solid was dissolved in 70 ml of acetonitrile. Charcoal, 3 tablespoons, was added to the solution, stirred and filtered. To the clear filtrate was added 700 ml of diethyl ether to precipitate the yellow diazonium salt. The salt was collected by filtration and dried. Yield 6.48 grams.

$^1$H NMR (DMSO-$d_6$) 9.54 (s, $C_4$, 1H), 8.62 (d, $C_2$, 1H), 8.37 (d, $C_1$, 1H), 8.17 (d, $C_8$, 1H), 7.92 (d, $C_5$, 1H), 7.75 (t, $C_6$, 1H), 7.53 (t, $C_7$, 1H), 4.63 (q, $CH_2$, 2H), 1.40 (t, $CH_3$, 3H).

IR (Nujol Mull) 2215 cm$^{-1}$ ($N_2^+$), 615 cm$^{-1}$ ($SbF_6^-$).

EXAMPLE 2

Preparation of 9-Ethyl-3-Carbazolediazonium Hexafluorophosphate

Experiment 1 was repeated using 4.03 g of $NaPF_6$ in place of the 6.16 g of $NaSbF_6$.

$^1$H NMR ($CD_3CN$) 9.15 (aromatic, 1H), 8.4–7.4 (m, aromatic, 6H), 4.55 (q, $CH_2$, 2H), 1.46 (t, $CH_3$, 3H).

IR (Nujol Mull) 2210 cm$^{-1}$ ($N_2^+$), 833 cm$^{-1}$ ($PF_6^-$).

| Elemental Analysis for $C_{14}H_{12}N_3F_6P$: | | | |
|---|---|---|---|
| Calculated: | C, 45.79; | H, 3.29, | N, 11.44 |
| Found: | C, 45.23; | H, 3.19; | N, 11.29 |
|  | C, 45.42; | H, 3.18; | N, 11.36 |

EXAMPLE 3

Preparation of 9-Ethyl-3-Carbazolediazonium Hexafluoroarsenate

Experiment 1 was repeated using 5.09 g of $NaAsF_6$ in place of the 6.16 g of $NaSbF_6$.

$^1$H NMR ($CD_3CN$) 9.14 (aromatic, 1H), 8.4–7.4 (m, aromatic, 6H), 4.55 (q, $CH_2$, 2H), 1.46 (t, $CH_3$, 3H).

IR (Nujol Mull) 2208 cm$^{-1}$ ($N_2^+$), 700 cm$^{-1}$ ($AsF_6^-$).

EXAMPLE 4

Preparation of 9-Ethyl-3-Carbazolediazonium Tetrafluoroborate

Experiment 1 was repeated using 2.62 g of $NaBF_4$ in place of the 6.16 g of $NaSbF_6$. In addition 240 ml of acetonitrile was used to dissolve the diazonium salt.

$^1$H NMR ($CD_3CN$) 9.15 (aromatic, 1H), 8.45–7.5 (m, aromatic, 6H), 4.53 (q, $CH_2$, 2H), 1.45 (t, $CH_3$, 3H).

IR (Nujol Mull) 2220 cm$^{-1}$ ($N_2^+$), 1050 cm$^{-1}$ ($BF_4^-$).

EXAMPLE 5

Preparation of 9-Methyl-3-Carbazolediazonium Hexafluoroantimonate

A. Preparation of 3,6-Dibromocarbazole

Carbazole (250 g) and 3 liter of $CS_2$ was placed into a 5 liter three-necked RB flask equipped with a reflux condenser, mechanical stirrer, heating mantle and HBr trap. The suspension was stirred and gently refluxed while a solution of 155 ml of $Br_2$ was added over a period of 1.75 hours. After the addition of the bromine was complete, the mixture was stirred until evolution of HBr was very slow (additional 1.5 hours). The slurry was filtered while warm to give a tan precipitate and a brown mother liquor. The precipitate was washed with 2×400 ml of water. The solid was dissolved in 4.5 l. of boiling ethanol, treated with 5 tablespoons of charcoal and filtered through a coarse frit. The filtrate was cooled over the weekend and filtered to give 251 g of needles, m.p. 205°–206° C.

$^1$H NMR (DMSO-$d_6$) 7.5 (m, aromatic, 4H), 8.36 (m, aromatic, 2H), NH exchanged with DMSO-$d_6$.

B. Preparation of 3,6-Dibromo-1-Nitrocarbazole

Acetic acid (600 ml) and 3,6-dibromocarbazole (45 g) was placed into a one liter three-necked RB flask equipped with a reflux condenser, mechanical stirrer, and heating mantle. The stirred solution was heated to reflux at which time a solution of nitric acid (10 ml, density 1.4 g/cc, 0.156 mole in 100 ml of acetic acid) was added over a period of 30 minutes. After $\frac{2}{3}$ of the nitrating mixture was added, a flocculent yellow precipitate deposited. The remainder of the nitrating mixture was added and the whole refluxed gently for one hour, cooled to 0° C. in an ice bath and filtered. The crude yellow precipitate softens at 232° C. and melts at 243°–246° C. The crude product was recrystallized from boiling acetonitrile to give yellow crystals with m.p. 252°–256° C. (uncovered), 256°–260° C. (covered). [H. Lindemann & F. Muhlhaus, Ber., 58, 2371 (1925) report a m.p. of 260° C. for the product].

$^1$H NMR (DMSO-$d_6$) 7.6 (m, aromatic, 2H), 8.29 (m, aromatic, 1H) 8.42 (m, aromatic, 1H), 8.76 (m, aromatic, 1H), NH exchanged with DMSO-$d_6$.

| Elemental Analysis for $C_{12}H_6Br_2N_2O_2$ | | | |
|---|---|---|---|
| Calculated: | C, 38.95; | H, 1.63; | N, 7.57 |
| Found: | C, 38.82; | H, 1.74; | N, 7.60 |
|  | C, 38.81; | H, 1.75; | N, 7.52 |

C. Preparation of 3,6-Dibromo-9-Methyl-1-Nitrocarbazole 3,6-dibromo-1-nitrocarbazole (3.56 g, 0.01 mole) was dissolved in 30 ml of warm DMSO followed by the addition of 30 ml of $CH_3I$. Then 2.0 g of 50% NaH dispersion in mineral oil (0.02 mole) was washed under $N_2$ with 2×50 ml of pentane, dried under $N_2$ and added rapidly to the DMSO solution. The solution turned purple immediately with $H_2$ evolution and became yellow in two minutes. Addition of 0.25 g of NaH did not cause the yellow slurry to turn purple indicating that the reaction was complete. Methanol (200 ml) was added cautiously to precipitate the product. The product was recovered by filtration, washed with 25 ml of methanol, 10×25 ml of water, 25 ml of methanol and air dried to give 3.40 g of product, m.p. 225°–226° C. (corrected). [H. Lindemann & F. Muhlhaus, Ber., 58, 2371 (1925) report a m.p. of 221° C. for the product].

$^1$H NMR (DMSO-$d_6$) 3.76 (s, 3H, $CH_3$), 7.65 (m, aromatic, 2H), 8.13 (m, aromatic, 1H), 8.48 (m, aromatic, 1H), 8.76 (m, aromatic, 1H).

| Elemental Analysis for $C_{13}H_8Br_2N_2O_2$ | | | |
|---|---|---|---|
| Calculated: | C, 40.66; | H, 2.10; | N, 7.29 |
| Found: | C, 39.66; | H, 2.14; | N, 7.19 |
|  | C, 39.73; | H, 2.16; | N, 7.25 |

D. Preparation of 1-Amino-9-Methyl Carbazole 3,6-Dibromo-9-methyl-1-nitrocarbazole (10 g) was dissolved in 300 ml of methanol. To the solution was added 50 g of Rexyn ™ (OH$^-$) form) and, under an atmosphere of carbon dioxide, 2 g of 5% Pd/C. The vessel was charged with 44.5 psi of $H_2$. During the course of the reaction the hydrogen pressure dropped to 32.8 psi (100% $H_2$ uptake). The crude reaction mixture was filtered and the clear solution was evaporated with a rotary evaporator using a vacuum pump and a water bath at 20° C. to give a white solid, m.p. 90°-92° C. Yield 2.77 g (54.3%). The product decomposed readily in air to a red solid.

$^1$H NMR (CDCl$_3$) 3.38 (br, s, 2H, NH$_2$), 3.80 (s, 3H, CH$_3$), 6.45-8.0 (m, aromatic, 7H).

E. Diazotization of 1-Amino-9-Methylcarbazole

1-Amino-9-methylcarbazole (2.77 g) was slurried with 200 ml of ice water and 20 ml of 1N HCl. To the white slurry was added 6.5 g of NaSbF$_6$ and the slurry cooled to 3° C. Then 2 g of NaNO$_2$ in 20 ml of water was added to give a brown precipitate. The precipitate was treated with a solution of 2 g of sulfamic acid dissolved in 20 ml H$_2$O and then washed with water. The precipitate was three times taken up in acetonitrile, treated with charcoal and precipitated with ether to give a bright yellow solid.

EXAMPLE 6

The General Procedure was followed using a coating solution containing 2.5 g of ECN-1299 and 1.25 g of 9-ethyl-3-carbazolediazonium hexafluorophosphate in 25 cc of 50:50 (v/v) cellosolve/acetonitrile. A 4"×4" aluminum plate was spin coated by placing 1 ml of coating solution in the center of the plate and spinning the plate at 1000 rpm. The coated plate was then dried to remove coating solvent. A total of 18 plates were prepared. Six plates were exposed through a cube root of two step wedge at a radiation flux of 4 milliwatts/cm$^2$ for 45 seconds and held at 0, 1, 2, 3, 5, and 10 minutes prior to development. The procedure was repeated at exposure times of 15 and 30 seconds. The data is listed in Table 1.

TABLE 1

| Plate | Exposure Time | Hold Time | Full Steps | Partial Steps |
|---|---|---|---|---|
| 1 | 15 seconds | 0 minutes | 0 | 0 |
| 2 | 15 seconds | 1 minute | 0 | 1 |
| 3 | 15 seconds | 2 minutes | 0 | 4 |
| 4 | 15 seconds | 3 minutes | 0 | 4 |
| 5 | 15 seconds | 5 minutes | 0 | 6 |
| 6 | 15 seconds | 10 minutes | 0 | 7 |
| 1 | 30 seconds | 0 minutes | 0 | 1 |
| 2 | 30 seconds | 1 minute | 0 | 6 |
| 3 | 30 seconds | 2 minutes | 0 | 5 |
| 4 | 30 seconds | 3 minutes | 0 | 8 |
| 5 | 30 seconds | 5 minutes | 0 | 9 |
| 6 | 30 seconds | 10 minutes | 3 | 11 |
| 1 | 45 seconds | 0 minutes | 0 | 5 |
| 2 | 45 seconds | 1 minute | 0 | 10 |
| 3 | 45 seconds | 2 minutes | 3 | 11 |
| 4 | 45 seconds | 3 minutes | 4 | 11 |
| 5 | 45 seconds | 5 minutes | 6 | 12 |
| 6 | 45 seconds | 10 minutes | 7 | 13 |

EXAMPLE 7

The General Procedure was followed using a coating solution containing 2.5 g of ECN-1299 and 1.25 g of 9-ethyl-3-carbazolediazonium hexafluoroantimonate in 25 cc of 50:50 (v/v) cellosolve/acetonitrile. A 4"×4" aluminum plate was spin coated by placing 1 ml of coating solution in the center of the plate and spinning the plate at 1000 rpm. The plate was then dried to remove the coating solvent. A total of 18 plates were prepared. Six plates were exposed through a cube root of two step wedge at a radiation flux of 4 milliwatts/cm$^2$ for 45 seconds and held at 0, 1, 2, 3, 5, and 10 minutes prior to development. The procedure was repeated at exposure times of 15 and 30 seconds. The data is listed in Table 2.

TABLE 2

| Plate | Exposure Time | Hold Time | Full Steps | Partial Steps |
|---|---|---|---|---|
| 1 | 15 seconds | 0 minutes | 0 | 0 |
| 2 | 15 seconds | 1 minute | 0 | 1 |
| 3 | 15 seconds | 2 minutes | 0 | 2 |
| 4 | 15 seconds | 3 minutes | 0 | 3 |
| 5 | 15 seconds | 5 minutes | 0 | 5 |
| 6 | 15 seconds | 10 minutes | 0 | 8 |
| 1 | 30 seconds | 0 minutes | 0 | 2 |
| 2 | 30 seconds | 1 minute | 0 | 6 |
| 3 | 30 seconds | 2 minutes | 0 | 8 |
| 4 | 30 seconds | 3 minutes | 0 | 8 |
| 5 | 30 seconds | 5 minutes | 0 | 9 |
| 6 | 30 seconds | 10 minutes | 2 | 12 |
| 1 | 45 seconds | 0 minutes | 0 | 9 |
| 2 | 45 seconds | 1 minute | 1 | 12 |
| 3 | 45 seconds | 2 minutes | 2 | 11 |
| 4 | 45 seconds | 3 minutes | 2 | 12 |
| 5 | 45 seconds | 5 minutes | 3 | 12 |
| 6 | 45 seconds | 10 minutes | 4 | 14 |

EXAMPLE 8

The General Procedure was followed using a coating solution containing 2.5 g of ECN-1299 and 1.25 g of 9-methyl-1-carbazolediazonium hexafluoroantimonate in 25 cc of 50:50 (v/v) cellosolve/acetonitrile. A 4"×4" aluminum plate was spin coated by placing 1 ml of coating solution in the center of the plate and spinning the plate at 1000 rpm. A total of 18 plates were prepared. Six plates were exposed through a cube root of two step wedge at a radiation flux of 4 milliwatts/cm$^2$ for 45 seconds and held at 0, 1, 2, 3, 5, and 10 minutes prior to development. The procedure was repeated at exposure times of 15 and 30 seconds. The data is listed in Table 3.

TABLE 3

| Plate | Exposure Time | Hold Time | Full Steps | Partial Steps |
|---|---|---|---|---|
| 1 | 15 seconds | 0 minutes | 0 | 0 |
| 2 | 15 seconds | 1 minute | 0 | 3 |
| 3 | 15 seconds | 2 minutes | 0 | 5 |
| 4 | 15 seconds | 3 minutes | 0 | 6 |
| 5 | 15 seconds | 5 minutes | 1 | 8 |
| 6 | 15 seconds | 10 minutes | 1 | 11 |
| 1 | 30 seconds | 0 minutes | 1 | 7 |
| 2 | 30 seconds | 1 minute | 1 | 9 |
| 3 | 30 seconds | 2 minutes | 2 | 11 |
| 4 | 30 seconds | 3 minutes | 2 | 12 |
| 5 | 30 seconds | 5 minutes | 3 | 12 |
| 6 | 30 seconds | 10 minutes | 5 | 14 |
| 1 | 45 seconds | 0 minutes | 1 | 10 |
| 2 | 45 seconds | 1 minute | 4 | 11 |
| 3 | 45 seconds | 2 minutes | 5 | 12 |
| 4 | 45 seconds | 3 minutes | 1 | 11 |
| 5 | 45 seconds | 5 minutes | 7 | 14 |
| 6 | 45 seconds | 10 minutes | 6 | 15 |

EXAMPLE 9

The General Procedure was followed using a coating solution containing 2.5 g of ECN-1299, 1.25 g of 9-ethyl-3-carbazolediazonium hexafluoroantimonate and 1.25 g of 9,10-dimethylanthracene in 25 cc of 50:50 (v/v) cellosolve/acetonitrile. A 4"×4" aluminum plate was spin coated by placing 1 ml of coating solution in the center of the plate and spinning the plate at 1000 rpm. The plate was then dried to remove coating solvent. A total of 18 plates were prepared. Six plates were exposed through a cube root of two step wedge at a radiation flux of 4 milliwatts/cm² for 45 seoncds and held at 0, 1, 2, 3, 5, and 10 minutes prior to development. The procedure was repeated at exposure times of 15 and 30 seconds. The data is listed in Table 4.

TABLE 4

| Plate | Exposure Time | Hold Time | Full Steps | Partial Steps |
|---|---|---|---|---|
| 1 | 15 seconds | 0 minutes | 0 | 1 |
| 2 | 15 seconds | 1 minute | 0 | 5 |
| 3 | 15 seconds | 2 minutes | 0 | 6 |
| 4 | 15 seconds | 3 minutes | 0 | 7 |
| 5 | 15 seconds | 5 minutes | 0 | 8 |
| 6 | 15 seconds | 10 minutes | 1 | 10 |
| 1 | 30 seconds | 0 minutes | 0 | 8 |
| 2 | 30 seconds | 1 minute | 1 | 8 |
| 3 | 30 seconds | 2 minutes | 2 | 11 |
| 4 | 30 seconds | 3 minutes | 4 | 11 |
| 5 | 30 seconds | 5 minutes | 3 | 12 |
| 6 | 30 seconds | 10 minutes | 4 | 13 |
| 1 | 45 seconds | 0 minutes | 4 | 11 |
| 2 | 45 seconds | 1 minute | 4 | 11 |
| 3 | 45 seconds | 2 minutes | 4 | 12 |
| 4 | 45 seconds | 3 minutes | 5 | 12 |
| 5 | 45 seconds | 5 minutes | 5 | 13 |
| 6 | 45 seconds | 10 minutes | 5 | 15 |

EXAMPLE 10

The General Procedure was followed using a coating solution containing 2.5 g of ECN-1299 and 1.25 g of the desired carbazole in 25 cc of 50:50 (v/v) cellosolve/acetonitrile. A 4"×4" aluminum plate was spin coated by placing 1 ml of coating solution in the center of the plate and spinning the plate at 1000 rpm. The plates were then dried to remove coating solvent. The plates were exposed through a cube root of two step wedge at a radiation flux of 4 milliwatts/cm² for 45 seconds and held 10 minutes in the absence of light prior to development. The plates were prepared and stored in the dark. They were irradiated 8.8 years later. The results are listed in Table 5.

EXAMPLE 11

The General Procedure was followed using a coating solution containing 2.5 g of ECN-1299 and 1.25 g of 9-ethyl-3-carbazolediazonium hexafluorophosphate in 25 cc of 50:50 (v/v) cellosolve/acetonitrile. A 4"×4" Mylar ® polyester film sheet taped to a metal disk was spin coated by placing 1 ml of coating solution in the center of the sheet and spinning the sheet at 1000 rpm. The Mylar ® sheet was then dried to remove coating solvent. The sheet was exposed through a cube root of two step wedge at a radiation flux of 4 milliwatts/cm² for 45 seconds and held 10 minutes in the absence of light prior to development. The plastic film was then washed with methanol and dyed with Orasol Black CR ™ to give a dark blue image with seven full steps and nine partial steps.

TABLE 5

| Plate | Compound | Full Steps | Partial Steps |
|---|---|---|---|
| 1 | 9-ethyl-3-carbazole-diazonium hexafluoroantimonate | 4 | 11 |
| 2 | 9-ethyl-3-carbazole-diazonium hexafluoroarsenate | 3 | 8 |
| 3 | 9-ethyl-3-carbazole-diazonium hexafluorophosphate | 3 | 7 |

TABLE 5-continued

| Plate | Compound | Full Steps | Partial Steps |
|---|---|---|---|
| 4 | 9-ethyl-3-carbazole-diazonium tetrafluoroborate | 0 | 2 |

The films showed no loss of photo speed and there were no signs of fogging after development.

COMPARATIVE EXAMPLES A, B, C

The General Procedure was followed using a coating solution containing 2.5 g of ECN-1299 and 1.25 g of p-nitrobenzenediazonium hexafluorophosphate in 25 cc of 50:50 (v/v) cellosolve/acetonitrile. A 4"×4" aluminum plate was spin coated by placing 1 ml of coating solution in the center of the plate and spinning the plate at 1000 rpm. The coated plate was then dried in the dark. The next day the plate was exposed through a cube root of two step wedge at a radiation flux of 4 milliwatts/cm² for 45 seconds and held at 10 minutes prior to development. After development the plate was badly fogged indicating that a dark reaction had taken place.

The above example was repeated using p-chlorobenzenediazonium hexafluorophosphate and benzenediazonium tetrafluoroborate. In both cases the plates after development were badly fogged.

While particular embodiments have been described, herein, it will be obvious to those skilled in the art that various changes and modifications may be made therein without departing from the invention and it is intended to cover in the appended claims all such changes and modifications as fall within the spirit and scope of the invention.

What is claimed is:

1. Carbazole diazonium salts of the following structures:

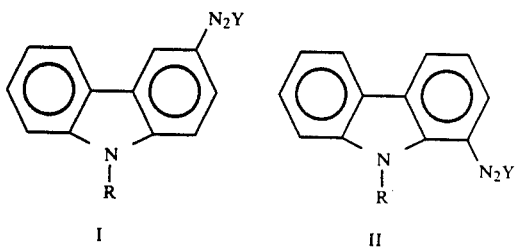

wherein:

Y is $PF_6^-$, $AsF_6^-$, $SbF_6^-$, $FeCl_4^-$, $SnCl_6^{-2}$, $SbCl_6^-$ or $BiCl_5^{-2}$; and R is selected from the group consisting of $C_xH_{2x+1}$ where x is 1–16, benzyl, phenyl, substituted benzyl, substituted phenyl and cycloalkyl, provided, however, where —N₂Y is in the "1" position as in formula II, R is not phenyl or substituted phenyl.

2. A light activated polymerizable composition, capable of dark storage without decomposition for extended periods of time, consisting essentially of:

(a) an epoxy pre-polymer;

(b) a carbazole diazonium salt selected from the following structures:

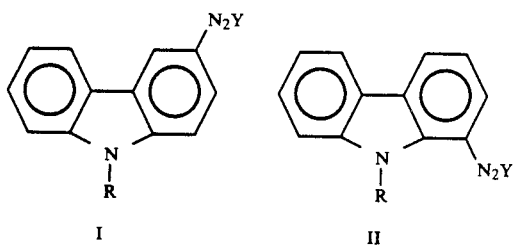

wherein:

Y is $BF_4^-$, $PF_6^-$, $AsF_6^-$, $SbF_6^-$, $FeCl_4^-$, $SnCl_6^{-2}$, $SbCl_6^-$ or $BiCl_5^{-2}$; and R is selected from the group consisting of $C_xH_{2x+1}$ where x is 1–16, benzyl, phenyl, substituted benzyl, substituted phenyl or cycloalkyl, provided, however, where —$N_2Y$ is in the "1" position as in formula II, R is not phenyl or substituted phenyl;

(c) optionally a photosensitizer;

(d) a solvent capable of dissolving the epoxy pre-polymer of (a) and the carbazole diazonium salt of (b); and, the optional photosensitizer.

3. The composition of claim 2 wherein the concentration of carbazole diazonium salt is in a range from 5 to 30 wt/v %.

4. The composition of claim 3 wherein the concentration of pre-polymer in solution is in a range of 10 to 30 wt/v %.

5. The composition of claim 2 wherein the pre-polymer is a polyglicidyl ether of orthocresolformaldehyde novolac resin.

6. The composition of claim 2 wherein the solvent is cellosolve, acetonitrile, or a mixture thereof.

7. The composition of claim 6 wherein the solvent is a 50/50(v/v) mixture of cellosolve and acetonitrile.

8. The composition of claim 2 containing a photosensitizer.

9. The composition of claim 8 wherein the photosensitizer is 9,10-dimethylanthracene.

10. A film consisting of the composition disclosed by claim 2.

11. A substrate coated with the film of claim 10.

12. The substrate of claim 11 wherein the substrate is selected from the group consisting of aluminum, glass and plastic.

13. A photoresist coated with the composition of claim 2.

14. In a process for polymerizing a monomeric or pre-polymeric epoxy material wherein the polymerization is initiated by the action of photoinitiated strong acid, in the presence of an optional photosensitizer and a solvent, the improvement comprising the use, as sources of strong acids, of carbazole diazonium salts of the following structures:

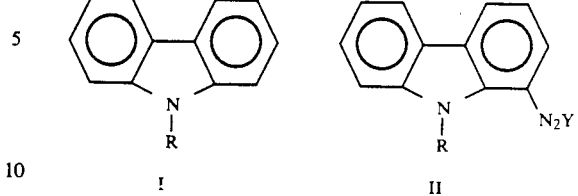

wherein:

Y is $BF_4^-$, $PF_6^-$, $AsF_6^-$, $SbF_6^-$, $FeCl_4^-$, $SnCl_6^{-2}$, $SbCl_6^-$ or $BiCl_5^{-2}$; and R is selected from the group consisting of $C_xH_{2x+1}$ where x is 1–16, benzyl, phenyl, substituted benzyl, substituted phenyl and cycloalkyl, provided, however, where —$N_2Y$ is in the "1" position as in formula II, R is not phenyl or substituted phenyl.

15. The process of claim 14 in which the pre-polymer used is a polyglycidyl ether of orthocresolformaldehyde novolac resin.

16. The process of claim 14 where the solvent is a cellosolve and acetonitrile mixture.

17. The process of claim 14 wherein a photosensitizer is used.

18. The process of claim 17 wherein the photosensitizer used is 9,10-dimethylanthracene.

19. In a process for the strong acid initiated removal of protective groups from a polymeric structure, where strong acid is generated upon exposure to a radient energy source, in the presence of an optional photosensitizer and an optional solvent, the improvement comprising the use, as a source of strong acid, of carbazole diazonium salts of the following structures:

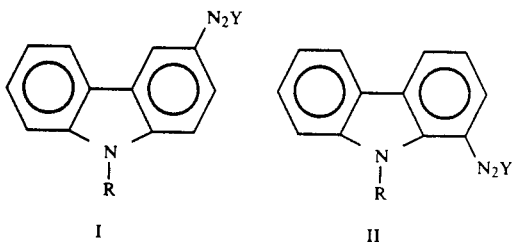

wherein:

Y is $BF_4^-$, $PF_6^-$, $AsF_6^-$, $SbF_6^-$, $FeCl_4^-$, $SnCl_6^{-2}$, $SbCl_6^-$ or $BiCl_5^{-2}$; and R is selected from the group consisting of $C_xH_{2x+1}$ where x is 1–16, benzyl, phenyl, substituted benzyl, substituted phenyl and cycloalkyl, provided, however, where —$N_2Y$ is in the "1" position as in formula II, R is not phenyl or substituted phenyl.

20. The process of claim 19 wherein the concentration of diazonium salts in the solution is in the range of 5 to 30 wt/v %.

21. The compounds of claim 1 used as sources of energy initiated acid.

22. A process for generating a strong acid consisting of exposing a carbazole diazonium salt of claim 1 to an incident energy source in the optional presence of a photosensitizer and the optional presence of a solvent.

23. The process of claim 22 wherein the energy source is selected from x-ray, ultraviolet and E-beam radiation.

* * * * *